United States Patent
Shimizu et al.

(10) Patent No.: US 12,390,941 B2
(45) Date of Patent: Aug. 19, 2025

(54) BLADE INTERVAL ADJUSTING DEVICE

(71) Applicant: Kawasaki Jukogyo Kabushiki Kaisha, Kobe (JP)

(72) Inventors: Ippei Shimizu, Kobe (JP); Yoshiki Maeda, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 880 days.

(21) Appl. No.: 17/628,900

(22) PCT Filed: Jul. 9, 2020

(86) PCT No.: PCT/JP2020/026775
§ 371 (c)(1),
(2) Date: Jan. 21, 2022

(87) PCT Pub. No.: WO2021/014982
PCT Pub. Date: Jan. 28, 2021

(65) Prior Publication Data
US 2022/0250255 A1    Aug. 11, 2022

(30) Foreign Application Priority Data

Jul. 23, 2019 (JP) ................................ 2019-135250

(51) Int. Cl.
*B25J 15/00* (2006.01)
*H01L 21/687* (2006.01)

(52) U.S. Cl.
CPC .... *B25J 15/0052* (2013.01); *H01L 21/68707* (2013.01)

(58) Field of Classification Search
CPC ....................... B25J 15/0052; H01L 21/68707
USPC ........................................... 294/213; 414/941
See application file for complete search history.

(56) References Cited

U.S. PATENT DOCUMENTS

| | | | |
|---|---|---|---|
| 6,244,121 B1 * | 6/2001 | Hunter | H01L 21/681 73/866.5 |
| 7,374,393 B2 * | 5/2008 | Rice | H01L 21/67178 414/744.5 |
| 7,572,093 B2 * | 8/2009 | Minami | H01L 21/68707 414/744.5 |

(Continued)

FOREIGN PATENT DOCUMENTS

| | | |
|---|---|---|
| JP | 2008-300609 A | 12/2008 |
| JP | 2018-161729 A | 10/2018 |

(Continued)

*Primary Examiner* — Paul T Chin
(74) *Attorney, Agent, or Firm* — XSENSUS LLP

(57) ABSTRACT

Blades, base parts to which the blades are fixed, a guide mechanism configured to guide movement of the base parts in a direction in which the base parts are arranged side by side, and a linkage mechanism configured to parallelly change intervals of the base parts according to angle changes of link members coupled to the base parts, are included. An interval fine-adjustment mechanism is provided at each of coupling parts between the base pars and the link members, the interval fine-adjustment mechanism being configured to finely adjust positions of the base parts in the direction in which the base parts are arranged side by side, individually. According to this, a blade interval adjusting device capable of finely adjusting the intervals of the blades which transfer wafers etc., is provided.

20 Claims, 6 Drawing Sheets

(56) References Cited

U.S. PATENT DOCUMENTS

| | | | |
|---|---|---|---|
| 12,183,612 B2* | 12/2024 | Hatano | ............... H01L 21/6838 |
| 12,211,720 B2* | 1/2025 | Hatano | ............. H01L 21/67742 |
| 2019/0389059 A1 | 12/2019 | Shibata et al. | |
| 2022/0093444 A1* | 3/2022 | Kuribayashi | ..... H01L 21/68707 |

FOREIGN PATENT DOCUMENTS

| | | |
|---|---|---|
| TW | 201707900 A | 3/2017 |
| TW | 201834801 A | 10/2018 |
| WO | 2017/011581 A1 | 1/2017 |

\* cited by examiner

BLADE INTERVAL ADJUSTING DEVICE

CROSS-REFERENCE TO RELATED APPLICATIONS

The present application is based on PCT filing PCT/JP2020/026775, filed Jul. 9, 2020, which claims priority to JP 2019-135250, filed Jul. 23, 2019, the entire contents of each are incorporated herein by reference.

TECHNICAL FIELD

The present disclosure relates to a device capable of finely adjusting intervals of blades which hold wafers etc.

BACKGROUND ART

Conventionally, in production of semiconductors, liquid crystal display panels, etc., it is necessary to transfer a substrate such as a wafer (hereinafter, the "wafer" is described as an example) from an accommodation container to a given device etc. In recent years, in such a transfer of the wafer, wafers may be moved together in order to reduce time etc. For example, a robot having a hand provided with blades is used for the wafer transfer. As illustrated in FIG. 6, for example, this robot is provided with a hand 100 (partially illustrated) with blades 101 which are arranged side by side. These blades 101 hold simultaneously wafers 111 accommodated in an accommodation container 110, and transfer them to the given device all together. Alternatively, the wafers may be held by the blades, and may be transferred to the accommodation container to be accommodated simultaneously.

Note that there is a wafer handling robot which grasps and transfers waters as this kind of conventional art (for example, see Patent Document 1).

REFERENCE DOCUMENT OF CONVENTIONAL ART

Patent Document

[Patent Document 1] JP2008-300609A

DESCRIPTION OF THE DISCLOSURE

Problem to be Solved by the Disclosure

However, when arranging the blades side by side, a minute inclination difference etc. may be produced between the blades. In such a case, an adjustment is made so that other blades become horizontal to a reference blade, but this adjustment may produce a minute deviation in the intervals of the blades. Note that such a problem is not described at all in Patent Document 1.

Therefore, one purpose of the present disclosure is to provide a blade interval adjusting device capable of finely adjusting, intervals of blades which transfer wafers etc.

SUMMARY OF THE DISCLOSURE

In order to achieve the purpose, the present disclosure includes blades, base parts to which the blades are fixed, a guide mechanism configured to guide movement of the base parts in a direction in which the base parts are arranged side by side, and a linkage mechanism configured to parallelly change intervals of the base parts according to angle changes of link members coupled to the base parts. An interval fine-adjustment mechanism is provided at each of coupling parts between the base parts and the link members, the interval fine-adjustment mechanism being configured to finely adjust positions of the base parts in the direction in which the base parts are arranged side by side, individually.

According to this configuration, after the intervals of the base parts arranged side by side are changed by the linkage mechanism, the interval between each base part and the adjacent base part can finely be adjusted individually by the interval fine-adjustment mechanism provided at the coupling part between the base part and the link member. Therefore, it becomes possible to finely adjust the intervals of the blades individually.

Effect of the Disclosure

According to the present disclosure, intervals of blades which transfer wafers etc. can finely be adjusted individually.

BRIEF DESCRIPTION OF DRAWINGS

FIG. 3(A) is a plan view and FIG. 3(B) is a front view.

MODE FOR CARRYING OUT THE DISCLOSURE

Hereinafter, one embodiment of the present disclosure is described based on the drawings. In the following embodiment, a blade interval adjusting device 1 provided to a hand 100 of a robot is described as an example. This blade interval adjusting device 1 is illustrated as an example in which blades are arranged side by side in the up-and-down direction. In the following embodiment, the concept of the left-and-right direction and the front- and rear direction are in agreement with the concept of the left-and-right direction and the front- and rear direction illustrated in FIG. 1, and the concept of the left-and-right direction and the up-and-down direction are in agreement with the concept of the left-and-right direction and the up-and-down direction illustrated in FIG. 2.

(Configuration of Blade Interval Adjusting Device)

Figure 1:
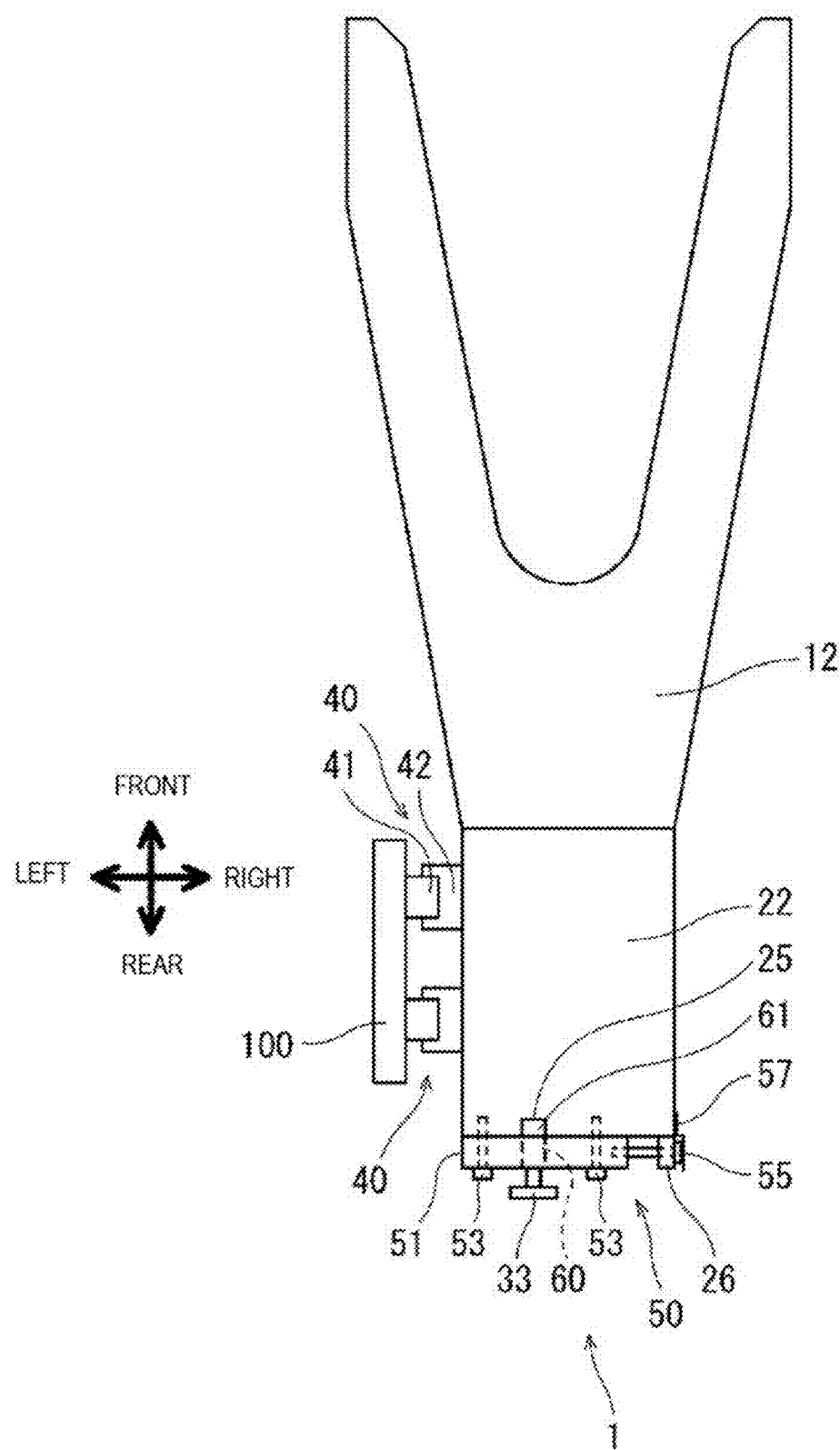
FIG. 1 is a plan view illustrating a blade interval adjusting device according to one embodiment of the present disclosure, and a blade.
Figure 2:
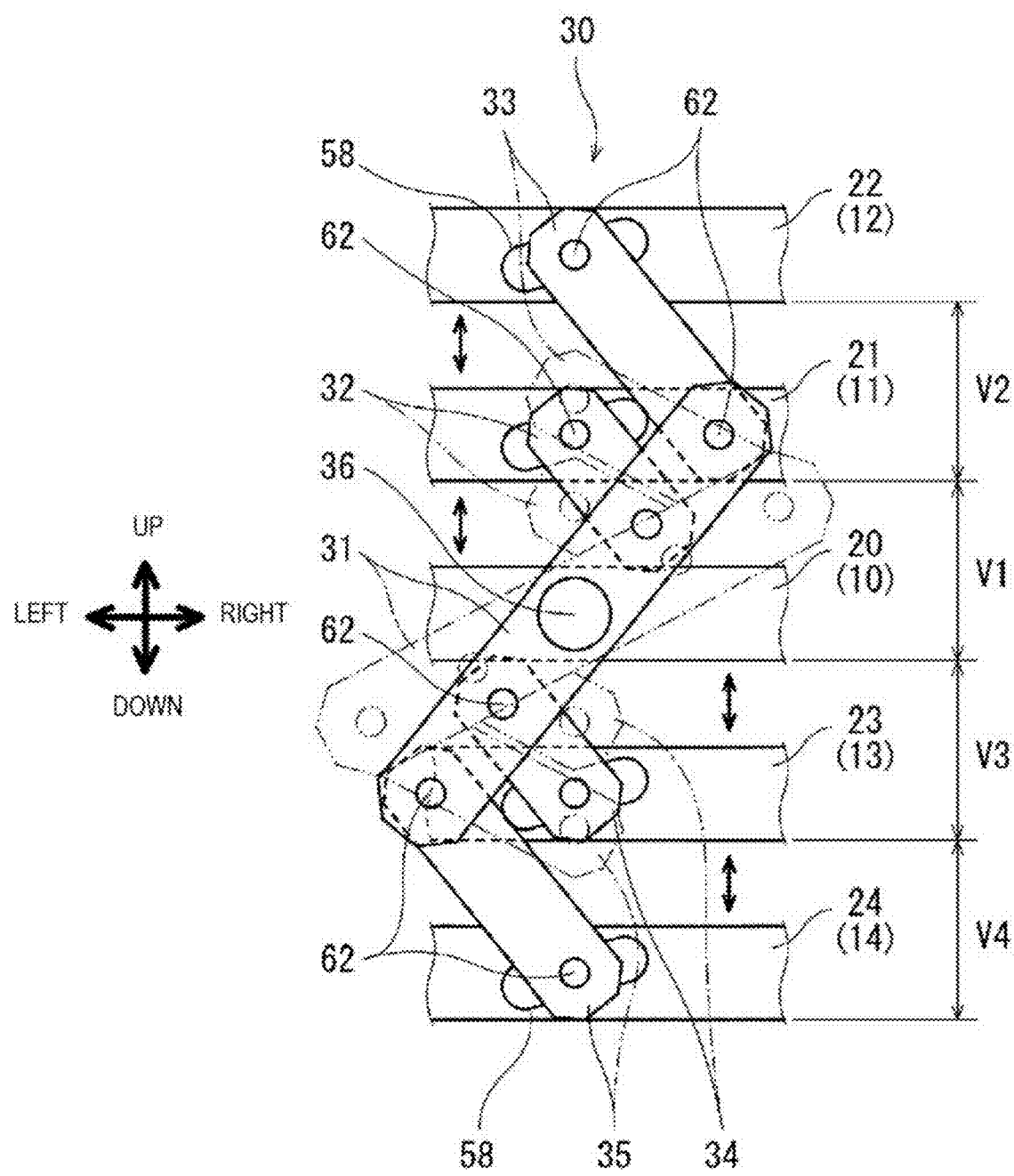
FIG. 2 is a rear view illustrating one example of a linkage mechanism which parallelly adjusts intervals of base parts to which blades are fixed.

FIG. 1 is a plan view illustrating the blade interval adjusting device 1 according to one embodiment, and a blade 12. FIG. 2 is a rear view illustrating one example of a linkage mechanism 30 which parallelly adjusts intervals V1-V4 of base parts 20-24 to which blades 10-14 are fixed. In FIG. 1, the topmost blade 12 in FIG. 2 is described as an example.

Figure 6:
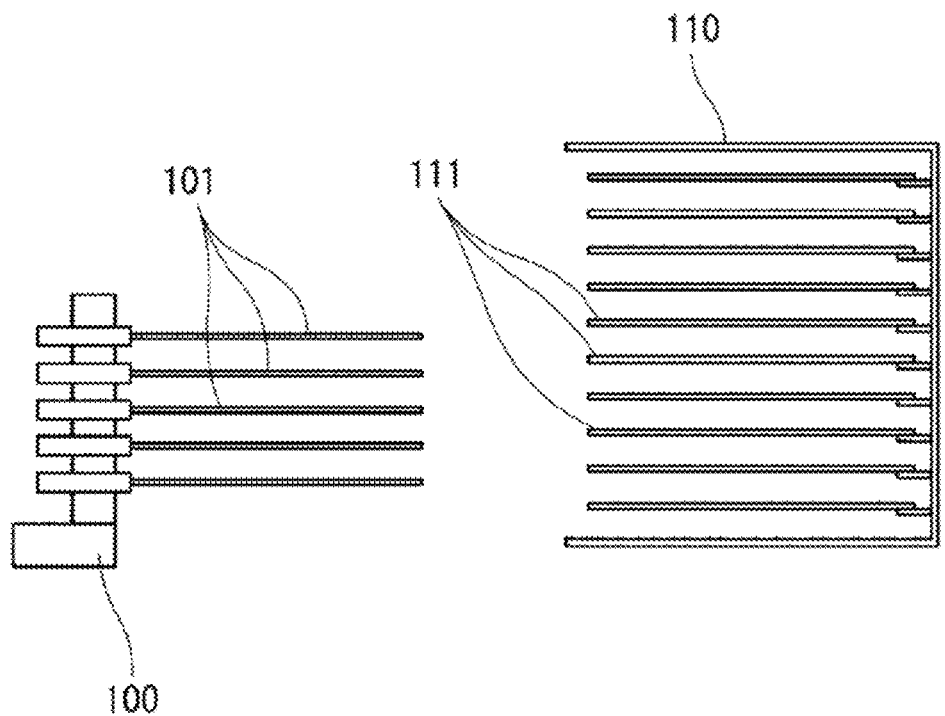
FIG. 6 is a side view schematically illustrating a hand provided with blades and an accommodation container which accommodates wafers.

As illustrated in FIG. 1, the blade 12 which holds a wafer 111 (FIG. 6) from below is fixed to a front part of the base part 22. The blade 12 is a thin-plate member of a fork shape where the point is divided into two. The shape of the blade 12 is not limited to this embodiment. The blade 12 is fixed to the base part 22 with bolts etc. As illustrated in FIG. 2, the base part 22 is arranged side by side in the up-and-down direction, and the base parts 20-24 are adjustable of the intervals V1-V4 in the up-and-down direction by link members 31-35 of the linkage mechanism 30, as will be described later. As illustrated in FIG. 1, the base part 22 is limited in the movement in the left-and-right direction by a guide mechanism 40 provided between the base part 22 and the hand 100, and is movable in the up-and-down direction in which the base part 22 is arranged side by side since it is guided by the guide mechanism 40. The guide mechanism 40 includes a guide rail 41 provided to the hand 100 and extending in the up-and-down direction, and a guide block 42 which is provided to the base part 22 and moves by being guided by the guide rail 41. The guide block 42 is provided to each of the base parts 20-24, and each of the base parts 20-24 moves in the up-and-down direction along the guide rail 41. A linear guide etc. can be used for the guide mechanism 40.

A coupling part between the base part 22 and the link member 33 is provided with an interval fine-adjustment mechanism 50 which finely adjusts the interval between the base part 22 and the adjacent base part 21. According to this interval fine-adjustment mechanism 50, the interval V2 of the base part 22 and another base part 21 can be finely adjusted in the up-and-down direction.

As illustrated in FIG. 2, the intervals of the base parts 20-24 to which the blades 10-14 arranged side by side in the up-and-down direction are fixed can be adjusted at a given interval in the up-and-down direction by the linkage mechanism 30. In this example, five base parts 20-24 are provided in the up-and-down direction, and a stationary base part 20 of which the position is fixed is provided to the center part. With respect to the stationary base part 20, a first movable base part 21 and a second movable base part 22 are provided above, and a third movable base part 23 and a fourth movable base part 24 are provided below.

In the stationary base part 20, the center part of the first link member 31 is supported by a shaft member 36, and the first link member 31 extends obliquely in the up-and-down direction. Between the first link member 31 and the first movable base part 21, it is coupled by the second link member 32. Between the first link member 31 and the second movable base part 22, it is coupled by the third link member 33. Between the first link member 31 and the third movable base part 23, it is coupled by the fourth link member 34, Between the first link member 31 and the fourth movable base part 24, it is coupled by the fifth link member 5. The coupling part between each of the link members 31-35 is rotatable by a shaft member 62.

By such a linkage mechanism 30, the interval V1 between the stationary base part 20 and the first movable base part 21 and the interval V2 between the first movable base part 21 and the second movable base part 22 are changed, above the stationary base part 20, according to an angle change in the first link member 31. In addition, below the stationary base part 20, the interval V3 between the stationary base part 20 and the third movable base part 23 and the interval V4 between the third, movable base part 23 and the fourth movable base part 24 are changed. Further, the intervals V1-V4 are changed at the same interval by the linkage mechanism 30.

That is, according to this linkage mechanism 30, the intervals V1 and V2 in the up-and-down direction of the first movable base part 21 and the second movable base part 22 above the stationary base part 20 which supports the first link member 31 can be parallelly adjusted by changing the angle of the first link member 31. Further, simultaneously, the intervals V3 and V4 in the up-and-down direction of the third movable base part 23 and the fourth movable base part 24 below the stationary base part 20 can be parallelly adjusted. The illustrated solid lines illustrate a state where the intervals V1-V4 are expanded, and the two-dot chain lines illustrate a state where the intervals V1-V4 are narrowed. Therefore, the link members 31-35 of the linkage mechanism 30 can adjust the intervals V1-V4 of the base parts 20-24 arranged side by side. The linkage mechanism 30 may be configured to control an angle of the first link member 31 by a motor, for example. Note that the linkage mechanism 30 is not limited to the linkage mechanism 30 of this embodiment. The linkage mechanism 30 may be configured to couple the base parts 20-24 by link members, respectively.

Then, after the linkage mechanism 30 adjusts the intervals V1-V4 of the base parts 20-24, the blades 10-15 are finely adjusted so as to be parallel to each other. The fine adjustment of the blades 10-15 is adjusted so that the first blade 11, the second blade 12, the third blade 13, and the fourth blade 14 become parallel to each other with respect to the fixed blade 10. The mechanism for finely adjusting the blades so that the blades 10-15 become parallel to each other is not limited. After the blades 10-15 are finely adjusted so that the blades become parallel to each other, the following fine adjustment by the interval fine-adjustment mechanism 50 is performed when minute errors are produced at the intervals V1-V4 of the blades 10-15.

(Detailed Configuration of Blade Interval Adjusting Device)

Figure 3:
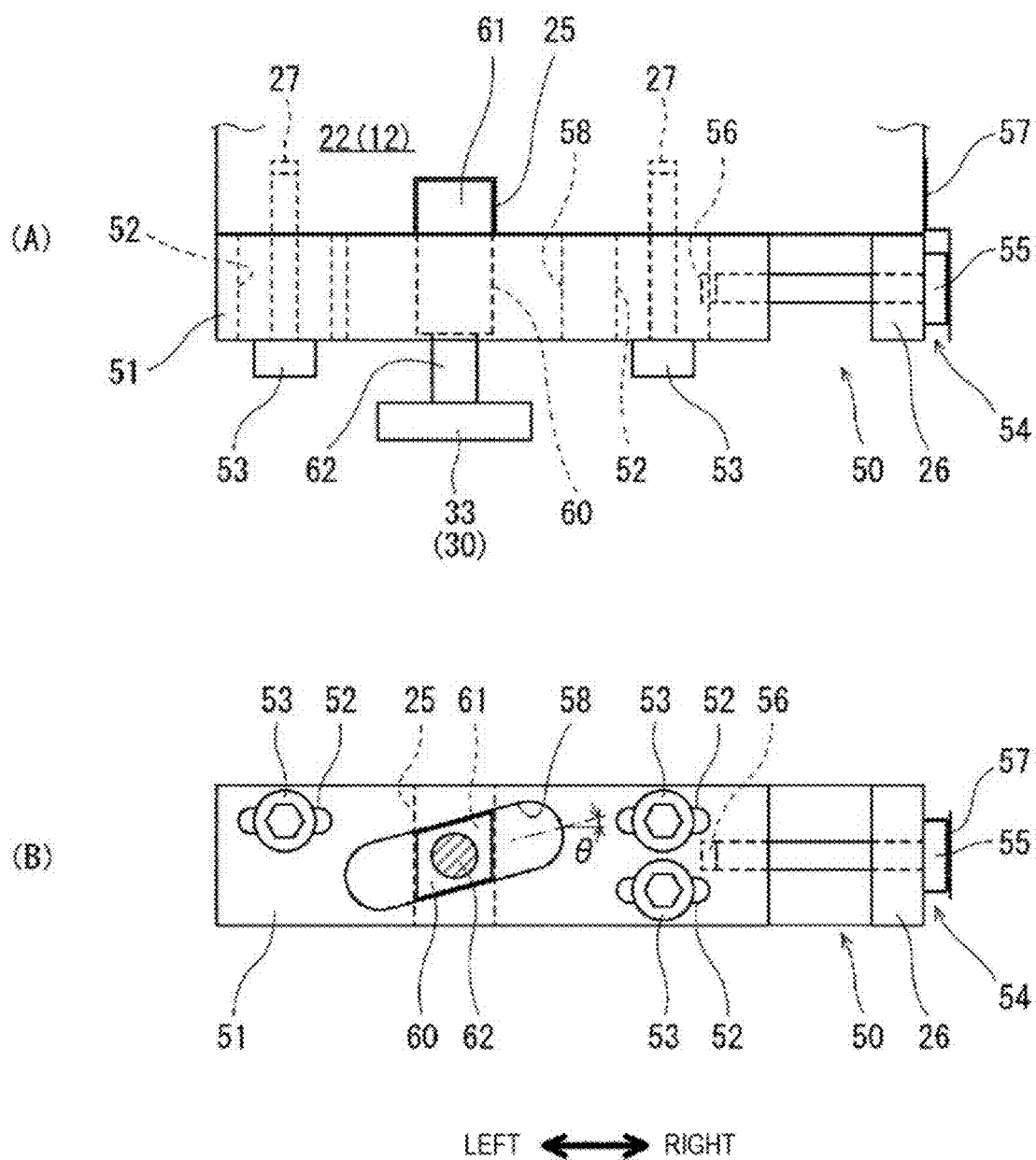
FIGS. 3(A) and 3(B) are views illustrating a part of the blade interval adjusting device illustrated in FIG. 1, where
Figure 4:
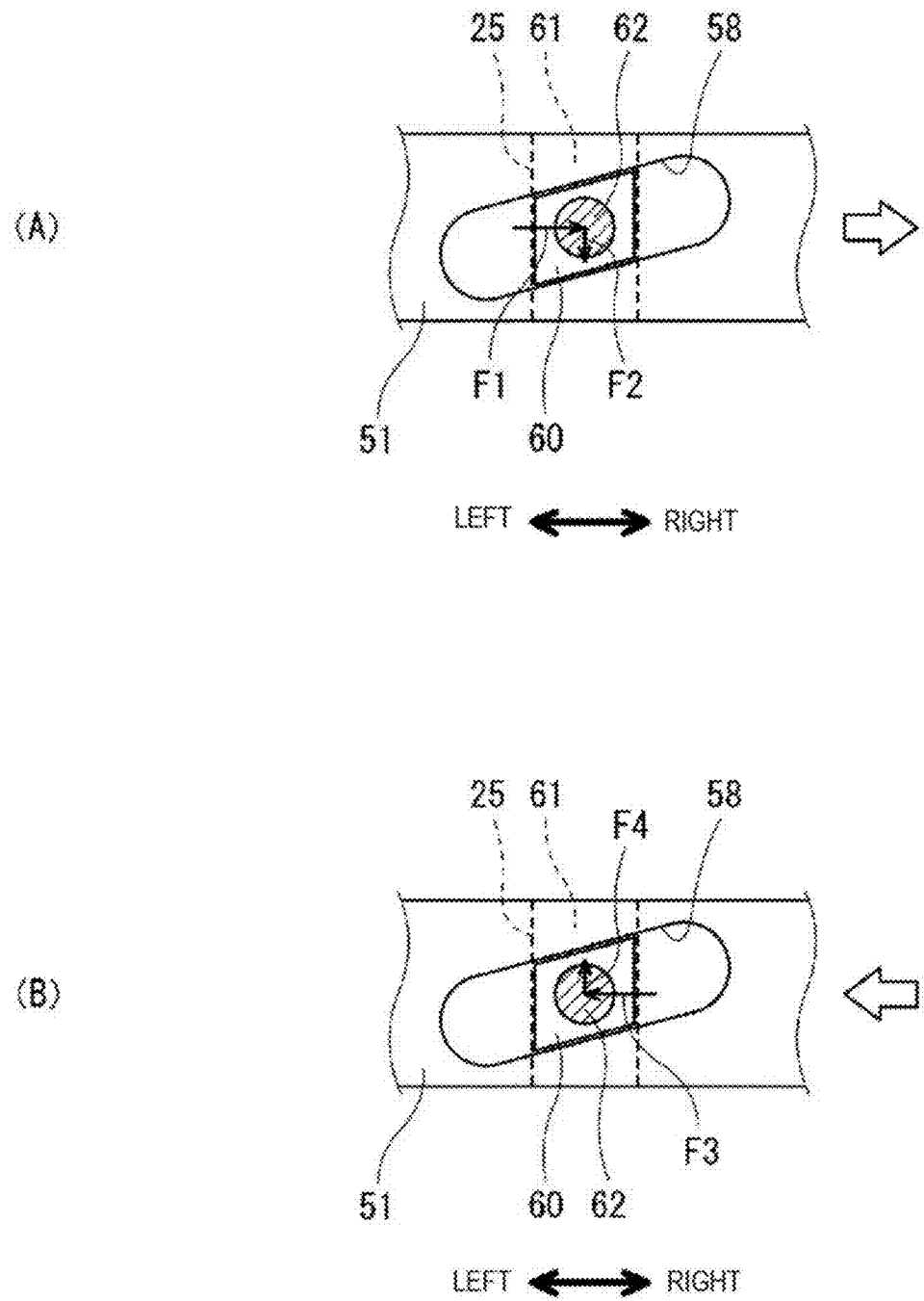
FIGS. 4(A) and 4(B) are enlarged views illustrating operation when adjusting intervals of the base parts by an interval fine-adjustment mechanism of the blade interval adjusting device illustrated in FIGS. 3(A) and 3(B).

FIGS. 3(A) and 3(B) are views illustrating a part of the blade interval adjusting device 1 illustrated in FIG. 1, where FIG. 3(A) is a plan view and FIG. 3(B) is a front view. FIGS. 4(A) and 4(B) are enlarged views illustrating operation when adjusting the intervals of the base parts 21-24 by the interval fine-adjustment mechanism 50 of the blade interval adjusting device 1 illustrated in FIGS. 3(A) and 3(B). Although the base parts 21-24 are each provided with the interval fine-adjustment mechanism 50, the interval fine-adjustment mechanism 50 provided to the base part 22 is described as an example also in the following description.

As illustrated in FIGS. 3(A) and 3(B), the interval fine-adjustment mechanism 50 of the blade interval adjusting device 1 includes a displacement block 51 which moves in the left-and-right direction with respect to the base part 22, a drive part 54 which moves the displacement block 51 in the left-and-right direction, and a slide block 60 which moves in the up-and-down direction in association with the movement of the displacement block 51.

Although in this embodiment the displacement block 51 is moved in the direction (left-and-right direction) perpendicular to the direction in which the base parts 20-24 are arranged side by side (up-and-down direction), the displacement block 51 may be moved in a direction which intersects with the direction in which the base parts 20-24 are arranged side by side.

The displacement block 51 is formed, at a part of the shaft member 62 which is coupled to the link member 33, with an inclined slot 58 which is an inclined guide part. The guide part of this example serves as the inclined slot 58 which is inclined at a small inclination angle θ, The slide block 60 is built inside the inclined slot 58 to be guided. Slotted holes 52 extending in the left-and-right direction are formed in the displacement block 51, and the displacement block 51 is fixed to the base part 22 by threadedly engaging a securing bolt 53 which is a fixing part inserted into the slotted hole 52 with an internally-threaded part 27 of the base part 22. The movement of the displacement block 51 is stopped by fixing the securing bolts 53. The displacement block 51 becomes movable in the left-and-right direction with respect to the base part 22 by loosening the securing bolts 53.

In this embodiment, the drive part 54 includes a threaded member 55 provided to a bracket part 26 provided to protrude rearwardly from the base part 22. The threaded member 55 is threadedly engaged with an internally-threaded part 56 of which a tip-end part is provided to the displacement block 51. The position of the head of the threaded member 55 is fixed by a keep plate 57 provided to the base part 22. By fixing the position of the head of the threaded member 55 with the keep plate 57, the displacement block 51 can be moved in the left-and-right direction, without the positional change in the head, even if the head of the threaded member 55 is rotated.

The slide block 60 is built inside a part of the inclined slot 58 of the displacement block 51, and is formed in a substantially parallelogram shape along the inclined slot 58. The slide block 60 includes a limiting part 61 protruding toward the base part 22 from the displacement block 51, and this limiting part 61 is fitted in a limiting slot 25 formed in the base part 22. In these drawings, gaps in the left-and-right-direction between the limiting part 61 and the limiting slot 25 are exaggeratedly illustrated. Therefore, the slide block 60 is permitted in the movement in the up-and-down direction, but the movement in the left-and-right direction is limited by the limiting slot 25. The slide block 60 is provided with the shaft member 62 coupled to the link member 33 so that the shaft member 62 protrudes rearwardly (toward a viewer of the drawing). Therefore, the shaft members 62 coupled to the link members 31-35 move in the up-and-down direction along the limiting slots 25 formed in the base parts 22.

According to such an interval fine-adjustment mechanism 50, when the intervals of the blades 10-15 need to be further finely adjusted individually after the linkage mechanism 30 adjusts the intervals V1-V4 of the base parts 20-24 to the given intervals, the intervals V1-V4 can be finely adjusted as follows.

As illustrated in FIG. 4(A), when the threaded member 55 of the drive part 54 is rotated so that the displacement block 51 is moved to the right, the slide block 60 built inside the inclined slot 58 of the displacement block 51 receives a rightward force F1 from the inclined slot 58. However, since the movement in the left-and-right direction is limited to the limiting slot 25 by the limiting part 61, the slide block 60 moves slightly downward by a downward force F2 acting from the inclined slot 58. Since the inclined slot 58 inclines with the small inclination angle θ, the movement of the slide block 60 becomes a small amount. For example, the moving amount becomes small enough to be absorbed by a gap of a bearing which supports the shaft member 62 at the third link member 33, elastic deformation of the shaft member 62, etc. Then, according to the small moving amount, the interval V2 between the second movable base part 22 and the first movable base part 21 arranged side by side next thereto can be finely adjusted. This fine adjustment may be about 0.1 mm, for example.

As illustrated in FIG. 4(B) when the threaded member 55 of the drive part 54 is rotated in the opposite direction to move the displacement block 51 to the left, the slide block 60 built inside the inclined slot 58 of the displacement block 51 receives a leftward force H from the inclined slot 58. However, since the movement in the left-and-right direction is limited to the limiting slot 25 by the limiting part 61, the slide block 60 moves slightly upward according to an upward force F4 acting from the inclined slot 58. Since the inclined slot 58 inclines with the small inclination angle θ, the movement of the slide block 60 becomes a small amount. This moving amount also becomes the small amount so as to be absorbed by the gap of the bearing which supports the shaft member 62 by the third link member 23, the elastic deformation of the shaft member 62, etc., for example. Then, by this small moving amount, the interval V2 between the second movable base part 22 and the first movable base part 21 arranged side by side next thereto can be finely adjusted. This fine adjustment can also be about 0.1 mm, for example.

Therefore, according to the blade interval adjusting device 1, since the linkage mechanism 30 adjusts the intervals V1-V4 of the base parts 20-24, and then, the interval fine-adjustment mechanisms 50 finely adjust the respective positions of the base parts 20-24 in the direction in which the base parts 20-24 are arranged side by side. Therefore, it becomes possible to finely adjust the respective intervals V1-V4 of the blades 10-14. The fine adjustment of the intervals V1-V4 by the interval fine-adjustment mechanisms 50 can be performed efficiently, even when the number of blades 10-14 (base parts 20-24) increases and, thus, it becomes possible, to shorten the operation time of the interval adjustment, reduce the labor, etc.

(Other Configurations)

Figure 5:
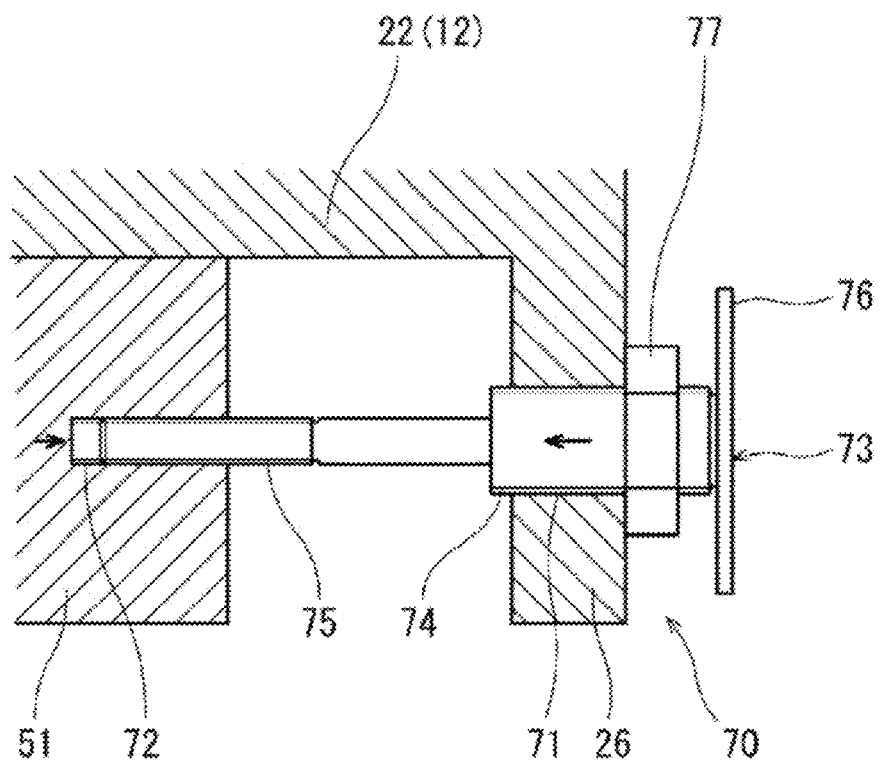
FIG. 5 is a cross-sectional view illustrating another example of a drive part of the blade interval adjusting device.

FIG. 5 is a cross-sectional view illustrating another example of the drive part 54 in the blade interval adjusting device 1. As illustrated, the drive part 54 may be a differential screw mechanism 70. The differential screw mechanism 70 may be provided to all of the first to fourth movable base parts 21-24. Note that the same reference characters are assigned to the same configuration as FIGS. 3(A) and 3(B) to omit the description.

In the differential screw mechanism 70 of this embodiment, a large pitch internally-threaded part 71 is provided to the bracket part 26 which protrudes rearward from the second movable base part 22, and a small pitch internally-threaded part 72 is provided to the displacement block 51. The large pitch internally-threaded part 71 includes the opposite thread from the small pitch internally-threaded part 72. Then, a large thread part 74 of a differential screw 73 is threadedly engaged with the large pitch internally-threaded part 71 of the bracket part 26, and a small thread part 75 is threadedly engaged with the small pitch internally-threaded part 72 of the displacement block 51. A gripper 76 for rotating the differential screw 73 is provided to a part of the large thread part 74 of the differential screw 73. Further, a lock nut 77 which fixes the position of the differential screw 73 is provided to the large thread part 74 located on the right side of the bracket part 26. Note that the differential screw 73 is not limited to this embodiment.

If the drive part 54 is the differential screw mechanism 70, when the gripper 76 is rotated once (one revolution) to move the large thread part 74 in the left-and-right direction by one pitch, since the displacement block 51 moves to the opposite side in the left-and-right direction by one pitch of the small thread part 75, the displacement block 51 moves by the pitch difference. Therefore, a further minute adjustment becomes possible. For example, the differential screw 73 may have such a configuration that the small thread part 75 moves to the right by 1 pitch (for example, 0.5 mm), when the gripper 76 is rotated once (one revolution) to move the large thread part 74 to the left by 1 pitch (for example, 1 mm). In this case, even if the gripper 76 is rotated one the displacement block 51 only moves to the left by the difference between one pitch of the large thread part 74 and the pitch of the small thread part 75 (in this example, 1 mm–0.5 mm=0.5 mm). Therefore, a further minute adjustment is possible. Note that the pitch of the large thread part 74 and the pitch of the small thread part 75 in the differential screw mechanism 70 may arbitrarily be set.

Thus, if the drive part 54 of the interval fine-adjustment mechanism 50 is the differential screw mechanism 70, it is possible to make the interval variation with respect to the adjusting amount by the drive part 54 much smaller, and a further minute interval adjustment becomes possible.

In the above embodiment, the interval fine-adjustment mechanism 50 includes the displacement block 51 which moves in the direction intersecting with the direction in which the base parts 20-24 are arranged side by side, the drive part 54 which moves the displacement block 51, and the slide block 60 which moves the coupling part between the base parts 21-24 and the link members 31-35 in association with the movement of the displacement block 51, and the securing bolts 53 which is the fixing part for stopping the movement of the displacement block 51. The base parts 21-24 include the limiting slots 25 which permit the movement of the slide block 60 in the direction in which the base parts 21-24 are arranged side by side, and limit the movement of the slide block 60 in the direction perpendicular to the direction in which the base parts 21-24 are arranged side by side. According to this configuration, by the drive part 54 moving the displacement block 51 in the direction intersecting with the direction in which the base parts 21-24 are arranged side by side, it is possible to generate the force for moving the slide block 60 obliquely along the inclined slot 58. Therefore, the force (F2, F4) in the direction in which the base parts 20-24 are arranged side by side acts on the slide block 60 to move, by the minute amount, the coupling part between the base parts 21-24 and the link members 31-35 in the direction in which the base parts 20-24 are arranged side by side. Thus, the intervals of the base parts 20-24 arranged side by side can be finely adjusted individually.

Further, the displacement block 51 includes the inclined slot 58 which is the inclined guide part for guiding the slide block 60. The slide block 60 moves in the direction, in which the base parts 20-24 are arranged side by side, with respect to the inclined slot 58 which is the guide part, in association with the movement of the displacement block 51. According to this configuration, the moving amount of the slide block 60 which moves in the direction in which the base parts 20-24 are arranged side by side can be reduced compared with the moving amount of the displacement block 51 which moves in the direction intersecting with the direction in which the base parts 20-24 are arranged side by side.

The drive part 54 may include the differential screw mechanism 70. According to this configuration, the differential screw mechanism 70 of the drive part 54 can reduce the moving amount of the displacement block 51 with respect to the driving amount of the drive part 54.

The above embodiment illustrates one example, and the interval fine-adjustment mechanism 50 may be a mechanism which moves the slide block 60 in the direction in which the base parts 20-24 are arranged side by side when the displacement block 51 is moved in the direction intersecting with the direction in which the base parts 20-24 are arranged side by side. The present disclosure may be variously changed without departing from the

What is claimed is:

1. A blade interval adjusting device, comprising:
   blades;
   base parts to which the blades are fixed;
   a guide mechanism configured to guide movement of the base parts in a direction in which the base parts are arranged side by side; and
   a linkage mechanism configured to parallelly change intervals of the base parts according to angle changes of link members coupled to the base parts,
   wherein an interval fine-adjustment mechanism is provided at each of coupling parts between the base parts and the link members, the interval fine-adjustment mechanism being configured to finely adjust positions of the base parts in the direction in which the base parts are arranged side by side, individually, wherein the interval fine-adjustment mechanism includes:
   a displacement block configured to move in a direction intersecting with the direction in which the base parts are arranged side by side;
   a drive part configured to move the displacement block;
   a slide block configured to move the coupling parts between the base parts and the link members in association with movement of the displacement block; and
   a fixing part configured to stop the movement of the displacement block,
   wherein the base parts include a limiting slot configured to permit movement of the slide block in the direction in which the base parts are arranged side by side and limit the movement of the slide block in a direction perpendicular to the direction in which the base parts are arranged side by side.

2. The blade interval adjusting device of claim 1, wherein the displacement block includes an inclined guide part configured to guide the slide block, and
   wherein the slide block moves in the direction in which the base parts are arranged side by side with respect to the guide part in association with the movement of the displacement block.

3. The blade interval adjusting device of claim 2, wherein the drive part includes a differential screw mechanism.

4. The blade interval adjusting device of claim 1, wherein the drive part includes a differential screw mechanism.

5. The blade interval adjusting device of claim 1, wherein: the displacement block includes a slotted hole.

6. The blade interval adjusting device of claim 1, wherein: fixing part includes a securing bolt.

7. The blade interval adjusting device of claim 1, wherein: the drive part includes an actuator.

8. The blade interval adjusting device of claim 1, wherein: the drive part includes a threaded member.

9. The blade interval adjusting device of claim 1, wherein: the inclined guide part includes an inclined slot.

10. The blade interval adjusting device of claim 1, wherein:
    the slide block includes a limiter and a shaft.

11. A blade interval adjusting device, comprising:
    blades;
    base parts to which the blades are fixed;
    a guide to guide movement of the base parts in a direction in which the base parts are arranged side by side;
    a linkage to parallelly change intervals of the base parts according to angle changes of links coupled to the base parts;
    couplers between the base parts and the links;

an interval fine adjuster at each of the couplers between the base parts and the links, the interval fine-adjuster to finely adjust positions of the base parts in the direction in which the base parts are arranged side by side, individually, wherein the interval fine adjuster includes:
a displacement block to move in a direction intersecting with the direction in which the base parts are arranged side by side;
a driver to move the displacement block;
a slide block to move the couplers between the base parts and the links in association with movement of the displacement block; and
a stop to stop the movement of the displacement block,
wherein the base parts include a limiting slot to permit movement of the slide block in the direction in which the base parts are arranged side by side and limit the movement of the slide block in a direction perpendicular to the direction in which the base parts are arranged side by side.

12. The blade interval adjusting device of claim 11, wherein:
the displacement block includes an inclined guide to guide the slide block, and
the slide block moves in the direction in which the base parts are arranged side by side with respect to the guide part in association with the movement of the displacement block.

13. The blade interval adjusting device of claim 12, wherein the driver includes a differential screw mechanism.

14. The blade interval adjusting device of claim 11, wherein the driver includes a differential screw mechanism.

15. The blade interval adjusting device of claim 11, wherein:
the displacement block includes a slotted hole.

16. The blade interval adjusting device of claim 11, wherein:
the stop includes a securing bolt.

17. The blade interval adjusting device of claim 11, wherein:
the driver includes an actuator.

18. The blade interval adjusting device of claim 11, wherein:
the driver includes a threaded structure.

19. The blade interval adjusting device of claim 11, wherein:
the inclined guide includes an inclined slot.

20. The blade interval adjusting device of claim 11, wherein:
the slide block includes a limiter and a shaft.

* * * * *